(12) United States Patent
Wu et al.

(10) Patent No.: US 9,844,135 B2
(45) Date of Patent: Dec. 12, 2017

(54) DECOUPLING CAPACITIVE ARRANGEMENT TO MANAGE POWER INTEGRITY

(71) Applicant: Cisco Technology, Inc., San Jose, CA (US)

(72) Inventors: Feng Wu, Shanghai (CN); Yongchao Ji, Shanghai (CN); Yang Tang, Shanghai (CN); Stephen Scearce, Apex, NC (US); Shunjia Liu, Shanghai (CN); Shaochun Tang, Changning (CN)

(73) Assignee: CISCO TECHNOLOGY, INC., San Jose, CA (US)

( * ) Notice: Subject to any disclaimer, the term of this patent is extended or adjusted under 35 U.S.C. 154(b) by 176 days.

(21) Appl. No.: 14/480,430

(22) Filed: Sep. 8, 2014

(65) Prior Publication Data

US 2016/0073500 A1 Mar. 10, 2016

(51) Int. Cl.
| | |
|---|---|
| *H05K 7/00* | (2006.01) |
| *H05K 1/11* | (2006.01) |
| *H05K 1/02* | (2006.01) |
| *H05K 1/18* | (2006.01) |
| *H05K 3/34* | (2006.01) |

(52) U.S. Cl.
CPC .......... *H05K 1/115* (2013.01); *H05K 1/0231* (2013.01); *H05K 1/113* (2013.01); *H05K 1/114* (2013.01); *H05K 1/181* (2013.01); *H05K 3/3415* (2013.01); *H05K 3/3436* (2013.01); *H05K 2201/09227* (2013.01); *H05K 2201/09609* (2013.01); *H05K 2201/10015* (2013.01); *H05K 2201/10674* (2013.01)

(58) Field of Classification Search
CPC ................... H05K 1/115; H05K 1/181; H05K 2201/09609; H05K 2201/10015
See application file for complete search history.

(56) References Cited

U.S. PATENT DOCUMENTS

| | | | | |
|---|---|---|---|---|
| 4,866,566 A | * | 9/1989 | Nishiyama | H01G 4/228 174/551 |
| 6,828,666 B1 | * | 12/2004 | Herrell | H01L 23/49827 257/691 |
| 7,906,734 B2 | * | 3/2011 | Del Rosario | H05K 1/023 174/261 |

(Continued)

*Primary Examiner* — Yuriy Semenenko
(74) *Attorney, Agent, or Firm* — Ronald Fernando

(57) ABSTRACT

Various implementations disclosed herein include arrangements that reduce parasitic inductance associated with a discrete decoupling capacitor by using a three-terminal capacitor and a staggered array of power supply and ground connections. In some implementations, a capacitive decoupling arrangement includes a substrate, an array of electrical vias of first and second types, and a capacitive arrangement on one side of the substrate coupled to the array of electrical vias. The array of electrical vias includes a first type of vias and a second type of vias. The capacitive arrangement is coupled between two respective vias of the first type of vias and two respective vias of the second type of vias on the first planar surface of the substrate. The capacitive arrangement includes a plurality of capacitive elements electrically arranged in parallel between the two respective vias of the first type of vias and the two respective vias of the second type of vias.

20 Claims, 5 Drawing Sheets

(56) References Cited

U.S. PATENT DOCUMENTS

| | | | |
|---|---|---|---|
| 8,031,480 B2 * | 10/2011 | Togashi | H01G 2/065 361/760 |
| 2013/0239083 A1 * | 9/2013 | Ueno | G06F 17/5081 716/136 |
| 2015/0237731 A1 * | 8/2015 | Toyama | H05K 1/0231 361/760 |

* cited by examiner

DECOUPLING CAPACITIVE ARRANGEMENT TO MANAGE POWER INTEGRITY

TECHNICAL FIELD

The present disclosure generally relates to integrated circuits, and in particular, to using capacitance in order to manage power supply stability for integrated circuits.

BACKGROUND

The ongoing development of electronics often involves incorporating more functionality onto a single integrated circuit (IC) chip or die. This end is pursued, in part, by advancing IC manufacturing processes. IC manufacturing processes typically progress in order to enable chips to use less power per transistor, while increasing transistor density and switching speeds. Even though power consumption per transistor tends to decrease, chips produced with newer processes often use more power. More power is consumed, in part, because of the integration of increasing complex electronics on a single chip. In other words, increasing the functionality of a single chip often includes increases in power consumption.

Ensuring power supply integrity becomes an increasingly difficult challenge for IC design and packaging as a result of increasing the functionality of a single chip. Managing power integrity refers to the task of providing a stable power supply that can accommodate relatively fast fluctuations in current drawn by integrated circuits on a chip. A conventional power supply module is often too slow to provide a fast enough transient current response for high frequency (i.e., high switching rate) integrated electronics.

A prior solution includes using a discrete decoupling capacitor as a fast local power supply to supplement the operation of a power supply module. However, discrete components often have parasitic flaws that degrade intended performance. For example, a decoupling capacitor has parasitic inductance that limits the use of the decoupling capacitor as a fast local power supply at relatively high frequencies. Rather, at high frequencies the parasitic inductance dominates the transfer function of the discrete decoupling capacitor.

In order to maintain power supply integrity of high frequency IC chips, attempts are made to reduce and/or control parasitic inductance associated with the use of a decoupling capacitor. However, as total power consumption and frequency of operation increase, managing parasitic inductance becomes an ever more challenging problem.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

DESCRIPTION

Numerous details are described herein in order to provide a thorough understanding of the illustrative implementations shown in the accompanying drawings. However, the accompanying drawings merely show some example aspects of the present disclosure and are therefore not to be considered limiting. Those of ordinary skill in the art will appreciate from the present disclosure that other effective aspects and/or variants do not include all of the specific details described herein. Moreover, well-known systems, methods, components, devices and circuits have not been described in exhaustive detail so as not to unnecessarily obscure more pertinent aspects of the implementations described herein.

OVERVIEW

Previously available discrete decoupling capacitor arrangements, provided as fast local power supplies for integrated circuit (IC) chips, typically have performance problems at high frequencies. High frequency performance is limited because of an inability to control parasitic inductance(s) associated with a discrete decoupling capacitor. By contrast, various implementations disclosed herein include arrangements that reduce parasitic inductance associated with a discrete decoupling capacitor by using a three-terminal capacitor and a staggered array of power supply and ground connections. In some implementations, a capacitive decoupling arrangement includes a substrate, an array of electrical vias of first and second types, and a capacitive arrangement on one side of the substrate coupled to the array of electrical vias as follows. The substrate includes first and second planar surfaces. The array of electrical vias extends from the first planar surface of the substrate to the second planar surface of the substrate, and includes a first type of vias and a second type of vias. The first type of vias and the second type of vias are arranged in an alternating rectangular pattern. The capacitive arrangement is coupled between two respective vias of the first type of vias and two respective vias of the second type of vias on the first planar surface of the substrate. The capacitive arrangement includes a plurality of capacitive elements electrically arranged in parallel between the two respective vias of the first type of vias and the two respective vias of the second type of vias.

Figure 1:
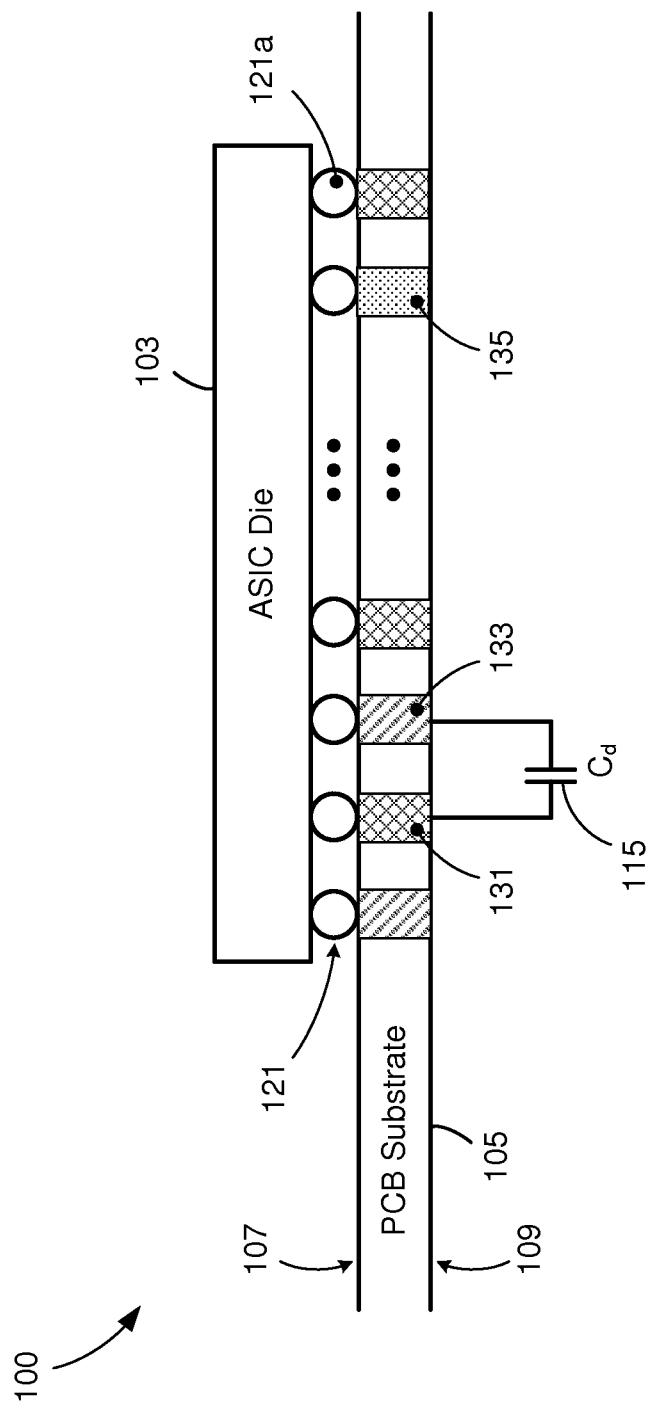
FIG. 1 is a cross-sectional view of a portion of an example integrated circuit (IC) chip packaging arrangement in accordance with some implementations.

FIG. 1 is a cross-sectional view of a portion of an example packaging arrangement 100 in accordance with some implementations. While pertinent features are illustrated, those skilled in the art will appreciate from the present disclosure that various other features have not been illustrated for the sake of brevity and so as not to obscure more pertinent aspects of the example implementations disclosed herein. To that end, as a non-limiting example, the packaging arrangement 100 includes an IC die 103 (e.g., an ASIC die), and a printed circuit board (PCB) substrate 105. While a PCB substrate is shown as an example, those of ordinary skill in the art will appreciate that various other implementations include any number of packaging and mounting substrates. Moreover, those of ordinary skill in the art will also appreciate that conductive traces typically present on a PCB substrate have not been illustrated for the sake of clarity and brevity.

The packaging arrangement 100 also includes a ball grid array (BGA) 121, that includes a number of individual solder balls 121a forming a two-dimensional pattern a first surface 107 of the PCB substrate 105. The BGA 121 is interposed between the IC die 103 and the first surface 107 of the PCB substrate 105. The PCB substrate 105 also includes a number of conductive vias 131, 133 and 135 that are each arranged to electrically couple to individual solder balls 121a. In other words, the various conductive vias 131, 133, 135 form a via array that substantially mirrors the arrangement of the BGA 121. Each via 131, 133, 135 provides a conductive path from the first surface 107 of the PCB substrate 105 to a second surface 109 of the PCB substrate 105 that is parallel to the first surface 107.

In some implementations, the first type of vias 131 (having a cross-hatch pattern) are used to provide power (or voltage) supply connections through corresponding solder balls 121a to the IC die 103. In some implementations, the second type of vias 133 (having a single diagonal hatch pattern) are used to provide ground connections through corresponding solder balls 121a to the IC die 103. In some implementations, the third type of vias 135 are used to provide input and/or output signal connections to the IC die 103.

The packaging arrangement 100 also includes a discrete decoupling capacitor 115 connected between a respective power supply connection via 131 (i.e., the first type of via) and a corresponding ground connection via 133 (i.e., the second type of via). As noted above, the discrete decoupling capacitor 115 is provided as a fast local power supply to supplement the operation of a power supply module (not shown). Also as noted above, the use of a discrete decoupling capacitor in this manner is limited at higher frequencies because of parasitic inductances associated with both the discrete decoupling capacitor 115 and the arrangement of the discrete decoupling capacitor 115 in relation to the IC die 103.

For example, in some instances it is undesirable to place the discrete decoupling capacitor 115 and the IC die 103 on the same side of the PCB substrate 105, because the conductive traces connecting one to the other add a significant amount of inductance. Moreover, there is often a lack of space for a decoupling capacitor on the same side of the PCB substrate 105 as the IC die 103. Accordingly, as shown in FIG. 1, in some implementations, it is preferable to place the discrete decoupling capacitor 115 and the IC die 103 on opposite sides of the PCB substrate 105 (so that the discrete decoupling capacitor 115 is below the IC die 103), which reduces the length of conductive paths between the two components. However, placing the discrete decoupling capacitor 115 below the IC die 103 creates additional challenges. One challenge is to provide large enough capacitance between adjacent vias within the via array, which typically has severe spatial constraints. Another challenge is to limit parasitic inductances introduced in discrete decoupling capacitor arrangements in accordance with various implementations.

Figure 2A:
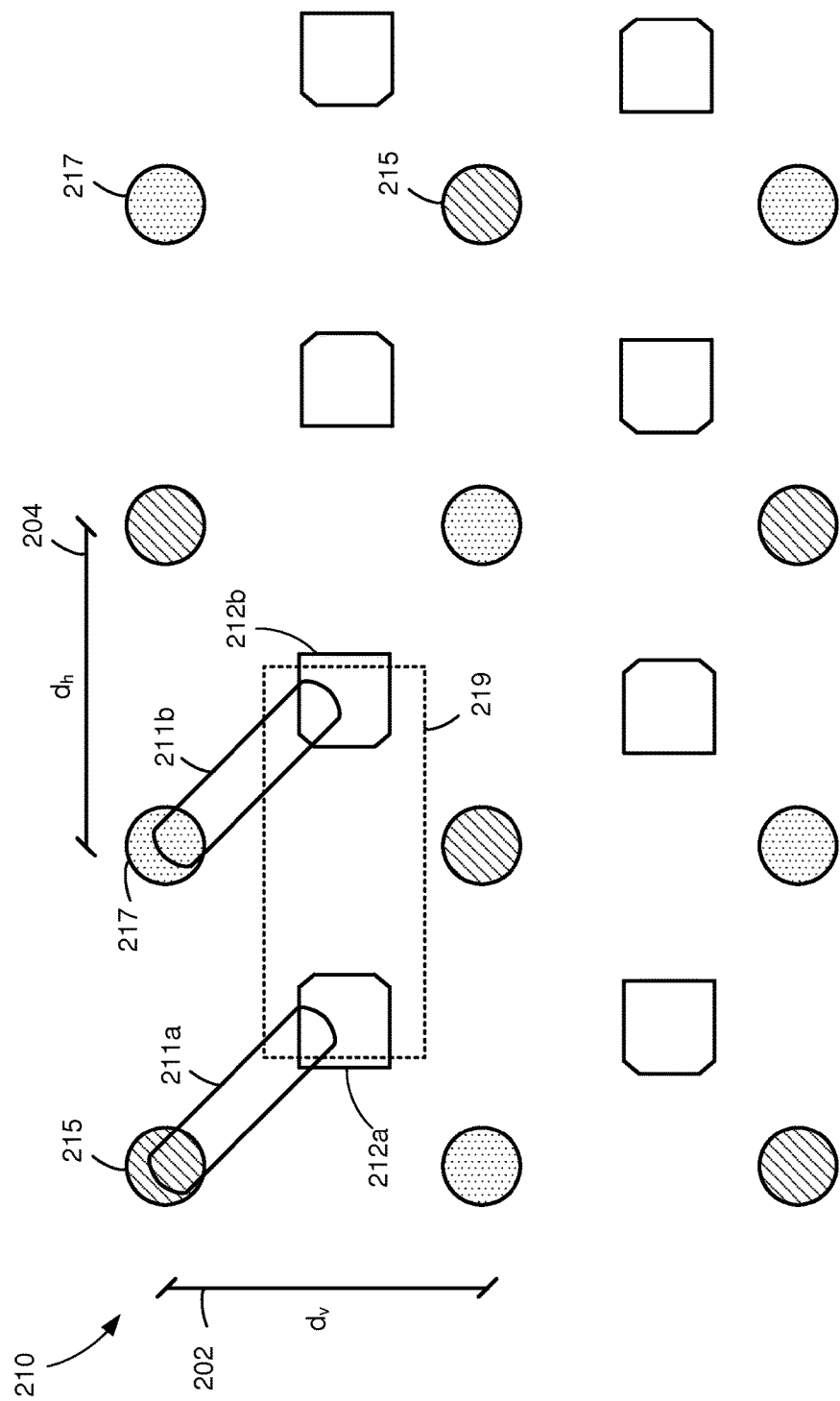
FIG. 2A is a plan view of a portion of a connection arrangement on one side of a mounting substrate in accordance with some implementations.

FIG. 2A is a plan view of a portion of a connection arrangement 210 on one side of a mounting substrate according to some implementations. As a non-limiting example, the connection arrangement 210 is representative of a non-VIPPO (via-in-pad plated over) arrangement. Moreover, as not above, while pertinent features are illustrated, those skilled in the art will appreciate from the present disclosure that various other features have not been illustrated for the sake of brevity and so as not to obscure more pertinent aspects of the example implementations disclosed herein.

In some implementations, the connection arrangement 210 includes first and second types of vias 215, 217 that are arranged in an alternating (i.e., staggered) rectangular grid pattern. The alternating rectangular grid pattern formed by the first and second types of vias 215, 217 substantially mirrors at least a portion of a BGA on the other side of the mounting substrate. In other words, each via of the first type of vias 215 is adjacent to one of the second type of vias 217 in the horizontal direction and in the vertical direction. As shown in FIG. 2A, in some implementations, the vertical distance 202 ($d_v$) between adjacent vias is substantially equal to the horizontal distance 204 ($d_h$) between adjacent vias. In some implementations, the vertical and horizontal distances are not substantially equal (i.e., $d_v \neq d_h$). In some implementations, the first type of vias 215 are used to provide power supply connections, and the second type of vias 217 are used to provide ground connections (or vice versa). In some implementations, other types of vias are provided for one or more other purposes.

The connection arrangement 210 also includes first and second connection pads 212a, 212b that are arranged in a corresponding alternating rectangular grid pattern, which is offset from the alternating grid pattern formed by the first and second types of vias 215, 217. At least one of the first connection pads 212a is coupled to a corresponding one of the first type of vias 215 by a respective conductive trace 211a. Similarly, at least one of the second connection pads 212b, adjacent to the first connection pad 212a, is coupled to a corresponding one of the second type of vias 217 by a respective conductive trace 211b. The respective conductive traces 211a, 211b are often referred to as fan-out traces by those of ordinary skill in the art. Additionally, a two-terminal capacitor 219 is coupled between the horizontally adjacent connection pads 212a, 212b in order to establish the decoupling capacitance arrangement. The total parasitic inductance of connection arrangement 210 includes a combination of contributions from the vias 215, 217, the fan-out traces 211a, 211b, the connection pads 212a, 212b, and the two-terminal capacitor 219.

One problem with the connection arrangement 210 is that the traces 211a, 211b add a significant amount of parasitic inductance that limits the use of the two-terminal capacitor 219 as a fast local power supply a high frequencies. In particular, as the power consumption of a die (e.g., IC die 103 of FIG. 1) increases, the parasitic inductance associated with the connection arrangement 210 is difficult, if not impossible, to reduce in order to provide sufficient power supply integrity. Another problem with the connection arrangement 210 is that selection of the two-terminal capacitor 219 is at least partially limited by the distance between the connection pads 212a, 212b. Additionally, the placement of the connection pads 212a, 212b limits how tightly a via array and thus a BGA can be packed.

Figure 2B:
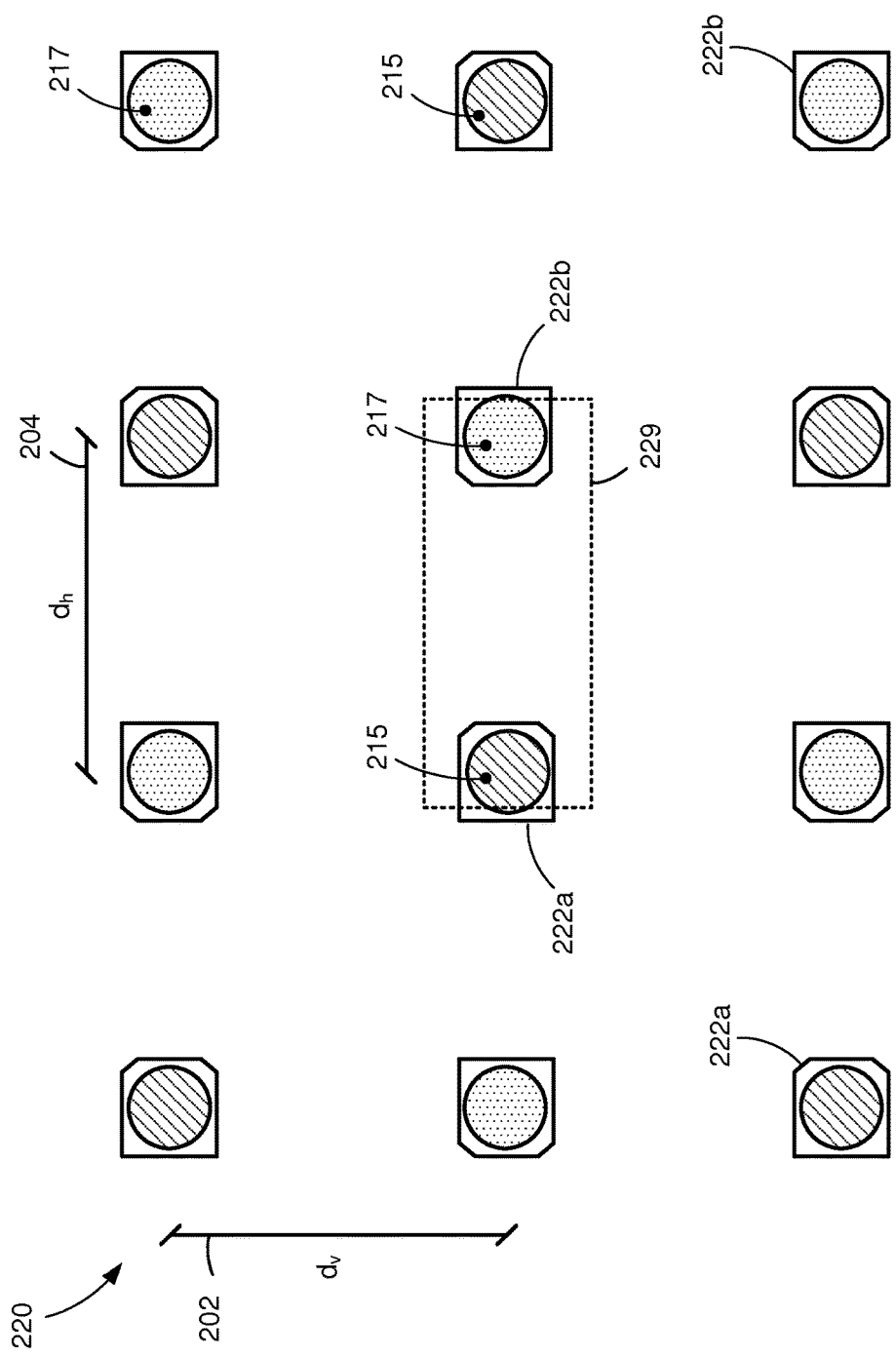
FIG. 2B is a plan view of a portion of a connection arrangement on one side of a mounting substrate in accordance with some implementations.

FIG. 2B is a plan view of a portion of another connection arrangement 220 according to some implementations. As a non-limiting example, the connection arrangement 220 is representative of a VIPPO arrangement, which substantially removes the use of fan-out traces. The connection arrangement 220 illustrated in FIG. 2B is similar to and adapted from the connection arrangement 210 illustrated in FIG. 2A. Elements common to each include common reference numbers, and only the differences between FIGS. 2A and 2B are described herein for the sake of brevity.

Similar to FIG. 2A, the connection arrangement 220 of FIG. 2B includes first and second types of vias 215, 217 that are arranged in an alternating rectangular grid pattern. However, instead of an arrangement of offset connection pads, the connection arrangement 220 includes first and second connection pads 222a, 222b that are arranged in an alternating grid pattern that correspondingly overlaps the alternating grid pattern formed by the first and second types of vias 215, 217. In other words, each connection pad is arranged directly on a respective via. Also, as shown in FIG. 2B, a two-terminal capacitor 229 is coupled between horizontally adjacent connection pads 222a, 222b.

The connection arrangement 220 generally has a lower amount of parasitic inductance than the connection arrangement 210. The total parasitic inductance is lowered by eliminating the conductive traces that are used to connect vias and pads in the connection arrangement 210. However, VIPPO arrangements are more expensive to manufacture than non-VIPPO arrangements. Another problem is that selection of the two-terminal capacitor 229 is at least partially limited by the staggered (or alternating) pattern of the first and second types of vias 215, 217. For example, a t-shirt decoupling capacitor cannot be used when for the staggered pattern of the first and second types of vias 215, 217. In some implementations, a t-shirt capacitor provides increased mechanical reliability associated with soldering for non-VIPPO, in-line via arrangements (i.e., power and ground vias in respective rows as shown in FIG. 2C).

Figure 2C:
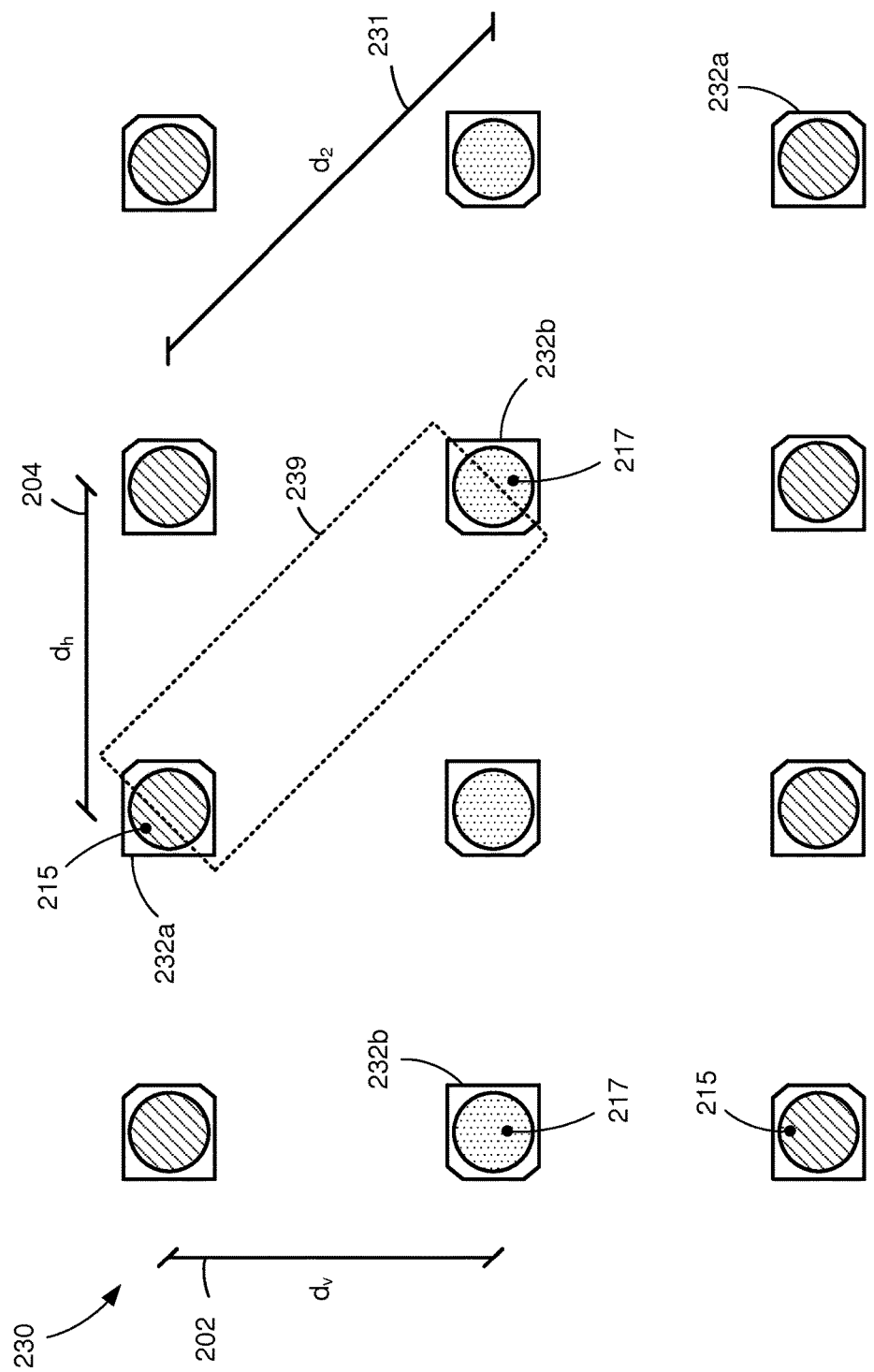
FIG. 2C is a plan view of a portion of a connection arrangement on one side of a mounting substrate in accordance with some implementations.

FIG. 2C is a plan view of a portion of another connection arrangement 230 in accordance with some implementations. The connection arrangement 230 illustrated in FIG. 2C is similar to and adapted from the connection arrangement 220 illustrated in FIG. 2B. Elements common to each include common reference numbers, and only the differences between FIGS. 2B and 2C are described herein for the sake of brevity.

As compared to the connection arrangement 220, the connection arrangement 230 includes first and second types of vias 215, 217 that are arranged in alternating rows. Each row includes one of the two types of vias 215, 217. The connection arrangement 230 also includes first and second connection pads 232a, 232b that are arranged in alternating rows that correspondingly overlap the alternating rows of the first and second types of vias 215, 217. Also, as shown in FIG. 2C, a two-terminal t-shirt decoupling capacitor 239 is diagonally coupled between a pair of first and second connection pads 232a, 232b. The diagonal distance 231 ($d_2$) between a corresponding pair of first and second types of vias 215, 217 is larger than the vertical and horizontal distances 202, 204 between adjacent vias. As such, a longer two-terminal t-shirt decoupling capacitor can be accommodated along the diagonal, which is not possible using the connection arrangements 210, 220 of FIGS. 2A and 2B. In some implementations, shorter components can be used by adding conductive trace. Similarly, in some implementations, longer components can be used sometimes when it is possible to chamfer or trim-down the electrical contacts of the components without impacting value of the capacitance. However, a problem with the connection arrangement 230 is that the parasitic inductance of the row-by-row arrangement of the first and second types of vias 215, 217 is higher than the parasitic inductance of the staggered (or alternating) grid pattern illustrated in FIG. 2B.

Figure 3:
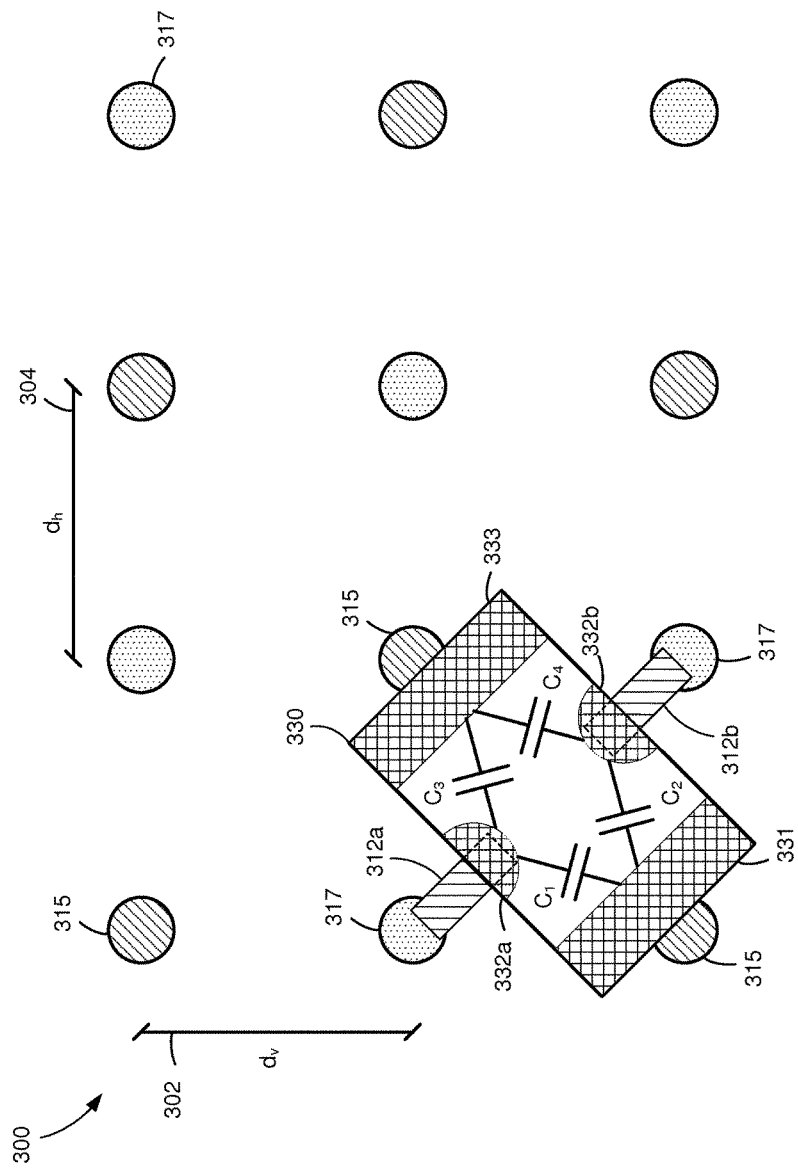
FIG. 3 is a plan view of a portion of a capacitive decoupling arrangement in accordance with some implementations In accordance with common practice various features shown in the drawings may not be drawn to scale, as the dimensions of various features may be arbitrarily expanded or reduced for clarity. Moreover, the drawings may not depict all of the aspects and/or variants of a given system, method or apparatus admitted by the specification. Finally, like reference numerals are used to denote like features throughout the figures.

The various implementations described herein include capacitive decoupling arrangements that provide substantial power supply integrity for higher frequency and/or higher power consuming integrated electronics. To that end, FIG. 3 is a plan view of a portion of capacitive decoupling arrangement 300 in accordance with some implementations. While certain specific features are illustrated, those skilled in the art will appreciate from the present disclosure that various other features have not been illustrated for the sake of brevity and so as not to obscure more pertinent aspects of the example implementations disclosed herein.

In some implementations, the capacitive decoupling arrangement 300 includes first and second types of vias 315, 317 that are arranged in an alternating (i.e., staggered) rectangular grid pattern. Generally, some implementations include an array of electrical vias that includes at least two of the first type of vias, and at least two of the second type of vias. In some implementations, a first one of the first type of vias is horizontally adjacent to a first one of the second type of vias, and veritically adjacent to a second one of the second type of vias, and diagonally adjacent to a second one of the first type of vias. For example, the alternating rectangular grid pattern formed by the first and second types of vias 315, 317 substantially minors at least a portion of a BGA on the other side of the mounting substrate. In other words, each via of the first type of vias 315 is adjacent to one of the second type of vias 317 in the horizontal direction and in the vertical direction. As shown in FIG. 3, in some implementations, the vertical distance 302 ($d_v$) between adjacent vias is substantially equal to the horizontal distance 304 ($d_h$) between adjacent vias. In some implementations, the vertical and horizontal distances are not substantially equal (i.e., $d_v \neq d_h$). In some implementations, the first type of vias 315 are used to provide power supply connections, and the second type of vias 317 are used to provide ground connections (or vice versa). In some implementations, other types of vias are provided for one or more other purposes.

The capacitive decoupling arrangement 300 also includes a three-terminal capacitor 330. In some implementations, the three-terminal capacitor 330 includes four two-terminal capacitors $C_1, C_2, C_3, C_4$ arranged in parallel between first, second and third external terminals 331, 332a,b, 333. The first, second, and third external terminals 331, 332a,b, 333 are the electrically operative connection points of the three-terminal capacitor 330. The second external terminals 332a and 332b are electrically coupled, and are thus a common electrical node, even though in some implementations the second external terminals 332a and 332b appear to be separate electrical connections. In some implementations, a common electrical node is coupled to two respective vias of the second type of vias. More specifically, in some implementations, the common electrical node includes two external terminals, each of the two external terminals coupled to a corresponding one of the two respective vias of the second type of vias. In some implementations, a first of the at least four capacitive elements is coupled to a first external terminal and a first portion of a common electrical node. In some implementations, second of the at least four capacitive elements is coupled to the first external terminal and a second portion of a common electrical node, wherein the common electrical node is coupled to the two respective vias of the second type of vias through at least one second external terminal. In some implementations, a third of the at least four capacitive elements is coupled to a third external terminal and the first portion of the common electrical node. In some implementations, a fourth of the at least four capacitive elements is coupled to the third external terminal and the second portion of a common electrical node. In some implementations, the at least four capacitive elements are included in a single discrete component.

In other implementations, a three-terminal capacitor does not include four two-terminal capacitors internally, but nevertheless has similar electrical performance. For example, in some implementations, a three-terminal capacitor includes an individual two-terminal capacitor and a combination of electrical connections that enable the individual two-terminal capacitor to be used as a three-terminal capacitor. That is, some implementations include a capacitive arrangement coupled between two respective vias of the first type of vias and two respective vias of the second type of vias on the first planar surface of the substrate, the capacitive arrangement including at least one capacitive element electrically arranged between the two respective vias of the first type of vias and the two respective vias of the second type of vias. In various implementations, a three-terminal capacitor includes a combination of two or more two-terminal capacitors provided in one or more arrangements that enable the combination to be used as a three-terminal capacitor. In other words, in some implementations, the plurality of capacitive elements a combination of two or more two-terminal capacitors.

With reference to FIG. 3, the first two-terminal capacitor $C_1$ is coupled between the first external terminal 331 and the second external terminals 332a,b of the three-terminal capacitor 330. The second two-terminal capacitor $C_2$ is also coupled between the first external terminal 331 and the second external terminals 332a,b of the three-terminal capacitor 330. The third two-terminal capacitor $C_3$ is coupled between the third external terminal 333 and the second external terminals 332a,b of the three-terminal capacitor 330. The fourth two-terminal capacitor $C_4$ is also coupled between the third external terminal 333 and the second external terminals 332a,b of the three-terminal capacitor 330. Due to the parallel connection of the four capacitances, the total parasitic inductance is substantially lower than the parasitic inductance of a single two-terminal capacitor. Moreover, in some implementations, the three-terminal capacitor 330 is integrated as a single discrete component further reducing the total parasitic capacitance of the four parallel capacitances.

As illustrated in FIG. 3, the three-terminal capacitor 330 is arranged diagonally so as to connect to two of the first type of vias 315 and also to two of the second type of vias 317 as follows. The first external terminal 331 is coupled to a first one of the first type of vias 315 (used for power connections to an IC die), and the third external terminal 333 is coupled to a second one of the first type of vias 315, the second being diagonally adjacent to the first. Additionally, a first one of the second type of vias 317 is coupled to the second external terminal 332a through a first conductive trace 312a. Similarly, a second one of the second type of vias 317 is coupled to the second external terminals 332b through a second conductive trace 312b.

The capacitive decoupling arrangement 300 generally has a lower amount of parasitic inductance than both of the connection arrangement 210 and the connection arrangement 230. Moreover, capacitive decoupling arrangement 300 has comparable performance to VIPPO arrangements represented by connection arrangement 220, but at a substantially lower cost.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A capacitive decoupling arrangement comprising:
a substrate having first and second planar surfaces;
an array of electrical vias extending from the first planar surface of the substrate to the second planar surface of the substrate, the array of electrical vias including a first type of vias and a second type of vias, wherein the first type of vias and the second type of vias are arranged in an alternating rectangular pattern, wherein the first type of vias is associated with a first voltage level and the second type of vias is associated with a second voltage level; and a capacitive arrangement coupled between two respective vias of the first type of vias and two respective vias of the second type of vias on the first planar surface of the substrate, the capacitive arrangement including
    a first set of capacitive elements electrically arranged in parallel between the two respective vias of the first type of vias and one of the second type of vias, and
    a second set of capacitive elements electrically arranged in parallel between the two respective vias of the first type of vias and another one of the second type of vias.

2. The capacitive decoupling arrangement of claim 1, wherein the capacitive arrangement includes a common electrical node that is coupled to the two respective vias of the second type of vias.

3. The capacitive decoupling arrangement of claim 2, wherein the common electrical node includes two external terminals, each of the two external terminals coupled to a corresponding one of the two respective vias of the second type of vias.

4. The capacitive decoupling arrangement of claim 1, wherein the capacitive arrangement includes at least four capacitive elements electrically coupled in parallel.

5. The capacitive decoupling arrangement of claim 4, wherein a first of the at least four capacitive elements is coupled to a first external terminal and a first portion of a common electrical node, a second of the at least four capacitive elements is coupled to the first external terminal and a second portion of a common electrical node, wherein the common electrical node is coupled to the two respective vias of the second type of vias through at least one second external terminal.

6. The capacitive decoupling arrangement of claim 5, wherein a third of the at least four capacitive elements is coupled to a third external terminal and the first portion of the common electrical node, a fourth of the at least four capacitive elements is coupled to the third external terminal and the second portion of a common electrical node.

7. The capacitive decoupling arrangement of claim 4, wherein the at least four capacitive elements are included in a single discrete component.

8. The capacitive decoupling arrangement of claim 1, wherein the capacitive arrangement includes a combination of two or more two-terminal capacitors.

9. The capacitive decoupling arrangement of claim 1, wherein the array of electrical vias includes at least two of the first type of vias, and at least two of the second type of vias.

10. The capacitive decoupling arrangement of claim 1, wherein a first one of the first type of vias is adjacent to a first one of the second type of vias in a first direction, adjacent to a second one of the second type of vias in a second direction perpendicular to the first direction, and adjacent to a second one of the first type of vias in a third direction different from first direction and the second direction.

11. The capacitive decoupling arrangement of claim 1, further comprising an integrated circuit die arranged on the second planar surface of the substrate.

12. The capacitive decoupling arrangement of claim 1, wherein the first voltage level corresponds with a power supply voltage level coupled to the first type of vias, and the second voltage level corresponds with a ground voltage level.

13. The capacitive decoupling arrangement of claim 1, wherein the substrate is a printed circuit board.

14. A capacitive decoupling arrangement comprising:
    a substrate having first and second planar surfaces;
    an array of electrical vias extending from the first planar surface of the substrate to the second planar surface of the substrate, the array of electrical vias including a first type of vias and a second type of vias, wherein the first type of vias and the second type of vias are arranged in an alternating rectangular pattern, wherein the first type of vias is associated with a first voltage level and the second type of vias is associated with a second voltage level; and
    a capacitive arrangement coupled between two respective vias of the first type of vias and two respective vias of the second type of vias on the first planar surface of the substrate, the capacitive arrangement being in the form of a three-terminal capacitor having a first terminal coupled to a first one of the two respective vias of the first type of vias, a second terminal coupled to both of the two respective via of the second type of vias, and a third terminal coupled to second one of the two respective vias of the first type of vias.

15. The capacitive decoupling arrangement of claim 14, wherein the capacitive arrangement include at least four capacitive elements electrically coupled in parallel.

16. The capacitive decoupling arrangement of claim 15, wherein a first of the at least four capacitive elements is coupled to a first external terminal and a first portion of a common electrical node, a second of the at least four capacitive elements is coupled to the first external terminal and a second portion of a common electrical node, wherein the common electrical node is coupled to the two respective vias of the second type of vias through at least one second external terminal.

17. The capacitive decoupling arrangement of claim 16, wherein a third of the at least four capacitive elements is coupled to a third external terminal and the first portion of the common electrical node, a fourth of the at least four capacitive elements is coupled to the third external terminal and the second portion of a common electrical node.

18. The capacitive decoupling arrangement of claim 15, wherein the at least four capacitive elements are included in a single discrete component.

19. The capacitive decoupling arrangement of claim 14, wherein the capacitive arrangement include a combination of two or more two-terminal capacitors.

20. The capacitive decoupling arrangement of claim 14, wherein the array of electrical vias includes at least two of the first type of vias, and at least two of the second type of vias.

\* \* \* \* \*